Aug. 17, 1965 J. W. H. FABER 3,201,240
LIGHT-SENSITIVE POLYCYCLOPENTADIENE AND POLYCYCLOHEXADIENE COMPOSITIONS AND PRINTOUT ELEMENTS PREPARED THEREWITH
Filed Sept. 24, 1962
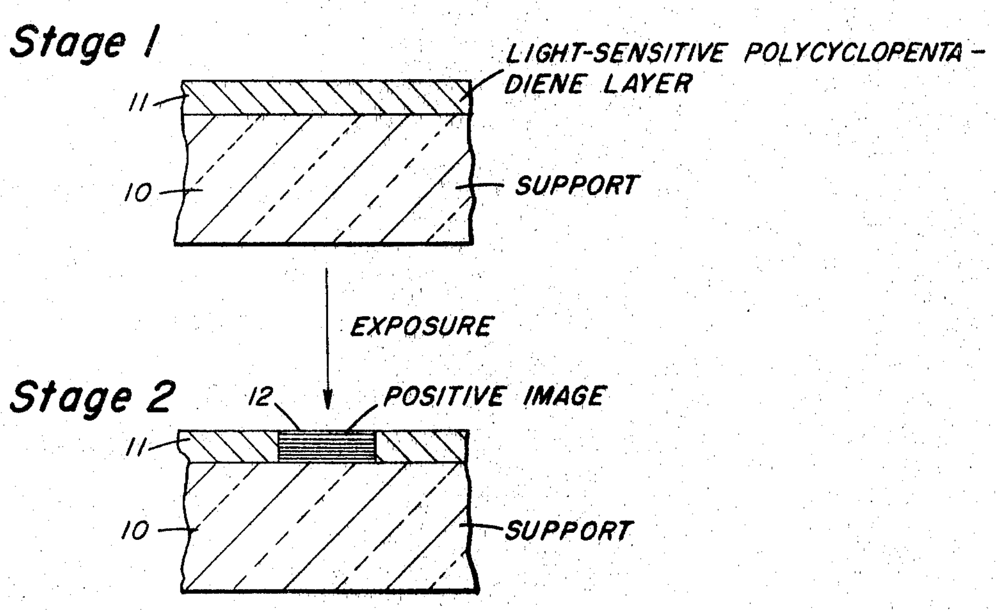
Stage 1, Stage 2
JAN W. H. FABER
INVENTOR.
BY R. Frank Smith
Donald W. Sprinell
ATTORNEYS United States Patent Office 3,201,240

Patented Aug. 17, 1965

3,201,240

LIGHT-SENSITIVE POLYCYCLOPENTADIENE AND POLYCYCLOHEXADIENE COMPOSITIONS AND PRINTOUT ELEMENTS PREPARED THEREWITH

Jan W. H. Faber, Hilton, N.Y., assignor to Eastman Kodak Company, Rochester, N.Y., a corporation of New Jersey Filed Sept. 24, 1962, Ser. No. 225,648

18 Claims. (Cl. 96—48)

This invention relates to light-sensitive compositions comprising resinous polymers of cyclopentadiene and cyclohexadiene and sensitizers therefor, and to materials prepared therewith which on exposure to light give colored printout images.

It is known that various colloids can be sensitized to light, for example with iodine or bromine, to give materials that may function as resists in photomechanical reproductions. In such processes the soluble colloid is rendered insoluble on exposure in just the exposed areas thereby making possible the development of a relief image by removing the soluble coloid from the unexposed areas by the use of an appropriate solvent. Examples of this type of resist process are set forth by M. C. Beebe et al. in U.S. Patents 1,587,269 and 1,587,274, dated June 1, 1926. However, the colloid images produced are generally colorless or faintly colored and require treatment with dyes or inks to increase the contrast. Accordingly, processes of this kind, although of utility in the printing art, are seriously limited in their applications and not adapted to the production of printout materials giving sharply contrasting colored images. I have now discovered that certain polymeric compositions comprising polymers of cyclopentadiene and cyclohexadiene on intimate admixture with certain halogenated compounds which act as sensitizers yield deeply colored and highly satisfactory printout images on exposure of thin layers thereof through a photographic negative without the use of any dyes or inks, i.e., the polymer becomes colored in situ in just the exposed areas to give essentially nonrelief type of colored images.

It is, accordingly, an object of the invention to provide a light-sensitive polymeric composition that becomes deeply colored on exposure. Another object is to provide a printout material comprising a support material and a layer thereon of the said light-sensitive composition. Another object is to provide a process for preparing the same. Other objects will become apparent hereinafter.

In accordance with the invention, I prepare the light-sensitive compositions of the invention by dissolving, for example, poly 1,3-cyclopentadiene or poly 1,3-cyclohexadiene in a suitable solvent such as methyl cyclohexane together with a suitable halogenated methane sensitizing compound represented by the general formula:

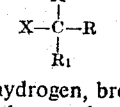

wherein R represents hydrogen, bromine, iodine, or chlorine, $R_1$ represents hydrogen, bromine or chlorine and each X represents bromine or chlorine in the proportions of about from 50 to 95% by weight of the polymer and from 50 to 5% by weight of the sensitizing compound. Typical sensitizing compounds that can be employed include methylene dibromide, methylene diiodide, bromoform, iodoform, methyl monochlorotribromide, methyl monochlorotriiodide, carbon tetrabromide, carbon tetraiodide and other similar and readily dissociated halogenated alkane compounds. Mixtures of the sensitizing compounds can be employed. Advantageously, the polymer and the sensitizing compound are dissolved separately in suitable solvents and these solutions then mixed to give the light-sensitive compositions of the invention. It is also of advantage to include an antioxidant for the polymer in the solutions thereof such as 2,5-di (4-methyl piperidino) hydroquinone and similar antioxidants known to the art. The amount of such antioxidant can vary widely, but from 0.5 to 2% is generally efficacious.

For preparing the light-sensitive sheet materials of the invention, the compositions prepared as above described are coated as thin layers promptly after their preparation onto a flexible opaque or transparent sheet support material which has relatively good dimensional stability such as paper, preferably sized, a cellulose derivative, e.g. cellulose acetate, cellulose propionate, cellulose acetate-butyrate, cellulose nitrate, etc., a polyamide such as nylon, a polyester such as polyethylene terephthalate, polystyrene, and the like. That is, the support may be any of the various materials known to be useful as photographic paper and film supports. The thickness of coated sensitive layer after drying can vary widely but thicknesses in the range of from 0.0001 to 0.001 inch are efficacious. If desired, where the support is ordinarily transparent, filling materials such as titanium dioxide can be incorporated to produce opaque or translucent supports. Subbing materials, such as gelatin, can also be used, if desired, to improve the adhesion of the light-sensitive layer to the support. The coated sheet is then dried to constant weight by conventional drying means, after which it can be put to immediate use, or stored for a time and then used, as a printout material by exposing it to an actinic light source such as a sunlamp through a photographic negative. In this case a positive dark blue positive image is obtained. However, this image is unstable and must be treated to make it permanent by a fixing process. This can be effectively accomplished by several ways, for example, by treating with a solvent such as acetone to remove the residual sensitizer, by treating with a tertiary amine such as triethylamine, tribenzylamine, etc. which render the image permanent by reaction with the residual active ingredients, or by subjecting the temporary image to heat of about from 150 to 250° F. for a period of about 15 seconds to several minutes or more. It is also within the scope of the invention to incorporate the tertiary amine into the coating composition prior to its use, in which case the resulting image is made but superficially permanent. The permanent images obtained by the solvent treatment are dark blue in color, while those obtained by treatment with tertiary amines and by heat treatment are dark brown in color. All of these images are very sharp and show extremely fine detail.

The accompanying drawing, Stage 1, shows a sectional view of the light-sensitive sheet material or element of my invention wherein the flexible support 10 composed of paper, a cellulose derivative, a polyamide, a polyester, polystyrene, and the like, has coated thereon a layer 11 of the polymeric light-sensitive composition of the invention.

Stage 2 shows the element of Stage 1 after exposure through a photographic negative, the layer 11 now containing a blue colored positive image 12 composed essentially of exposed polymer. The resinous polycyclopentadiene and polycyclohexadiene polymers may be prepared by well known polymerization procedures employing heat and catalysts to accelerate the polymerizations. While suspension or mass polymerization techniques can be used, the preferred process is to polymerize the monomers in solution in an inert hydrocarbon solvent such as benzene, toluene, methyl cyclohexane, etc., in the presence of stannic chloride, aluminum trichloride, boron trifluoride, and the like, or hydrogen chloride gas, as polymerization catalyst in an amount of from about 0.5 to 2.0%, based on the weight of the monomer to be polymerized. The polymer formed is then conveniently separated from its reaction solution by precipitation into a nonsolvent such as methanol, filtered out, washed with fresh methanol and dried.

The following examples will serve to illustrate further the preparation of the light-sensitive compositions of the invention, the application of the same to produce light-sensitive sheets, and to the manner of using these sheets to produce colored printout images.

*Example 1*

250 ml. of 1,3-cyclopentadiene obtained by cracking a substantially larger quantity of dicyclopentadiene was dissolved in 400 ml. of benzene and 1 ml. of stannic chloride ($SnCl_4$) in 10 ml. of benzene was added to the solution as polymerization catalyst. Polymerization started almost at once and when completed, the homopolymer of cyclopentadiene which had formed in solution was precipitated into methanol, filtered out and washed whereby the polymer was obtained substantially free from residual catalyst. The polymer was then redissolved in 500 ml. of methyl cyclohexane and stabilized by the addition of 2,5-di(4-methyl piperidino)hydroquinone.

A light-sensitive coating composition was then prepared by mixing together 1 ml. of the above stabilized polycyclopentadiene solution with a solution of 0.1 g. of carbon tetrabromide as sensitizer in 1 ml. of chloroform. A coating of this mixture was promptly made upon ordinary sized paper and air dried to constant weight. At this point the coating is virtually colorless. The coated sheet was then exposed at a distance of a few inches to the action of an ordinary ultraviolet sunlamp through a photographic negative for a period of approximately 60 seconds. The resultant temporary blue image which appeared on the sheet was then rendered permanent by washing the sheet repeatedly in acetone to remove the residual sensitizer. The dark blue image thus obtained was very sharp, without background color, and showed extremely fine detail and could be placed in a window indoors and exposed to the action of incident sunlight for a period of days without loss of legibility of the printed image and with only a rather slow appearance of background color.

By substituting 1,3-cyclohexadiene or 1,4-cyclohexadiene in place of the 1,3-cyclopentadiene in the above example, generally similar dark blue images can be obtained which likewise become permanent by treatment with acetone.

*Example 2*

An image similar to that described in Example 1 was obtained in exactly the same manner except that the temporary image was stabilized here by soaking in aniline. In this case, a dark brown permanent image was obtained. It is believed that in this procedure image permanence is due to the reaction of the aniline with one of the active (sensitizing) ingredients in the formula, namely with the carbon tetrabromide to inactivate it, wherein the process of Example 1 permanence of the image was attained by virtually complete removal of all possible reactive ingredients from the image bearing sheet.

*Example 3*

Results which were superficially similar to those described in the preceding examples were obtained here by adding a ternary amine (triethylamine) to the initial coating composition of Example 1 just prior to its application to the paper sheet. The image formed on this sheet on exposure through a negative as before remained legible for a few hours, after which it slowly turned dark on continued exposure through ordinary window glass to direct sunlight. This kind of light-sensitive sheet material is useful for certain reproductions where permanent stability is not required.

*Example 4*

A temporary image formed as in Example 1 was heated for one-half minute to one minute at 150 to 250° F. The original blue colored image turned to a dark brown color, while the unexposed areas remained white. Subsequent exposure to sunlight for 14 days did not cause any noticeable fading of the image, nor did any background color appear. Exposure of another sample of the heat treated sheet to a sunlamp overnight showed a similar good result. In this case, the stabilization is believed due to the removal of the residual carbon tetrabromide sensitizer by the heat treatment.

The invention has been illustrated in the above examples with just the preferred sensitizing compound, carbon tetrabromide. However, it will be apparent that any other of the specifically mentioned sensitizers, methylene dibromide, methylene diiodide, bromoform, iodoform, methyl monochlorotribromide, methyl monochlorotriiodide and carbon tetraiodide can be substituted in like proportion in the above examples to give generally similar excellent colored images by the described processes.

While the theoretical aspects of my invention are not presently susceptible of exact proof, I offer the following explanation of what is believed to occur in the process of the invention, it being understood as not necessarily binding. It appears that the relatively high molecular weight cationically polymerized homopolymers of the invention are linear in character and susceptible to oxidation. They are only meta-stable in the presence of sufficient abundance of protons. When these are provided, from any of a variety of sources, the residual double bond system in the polymer is rendered active or mobile and seeks the lowest energy level possible for stability. This turns out to be a rather extensive system of conjugated double bonds causing absorption of some wave lengths of visible light and hence color. In the preceding examples, the proton sources are light-sensitive substances such as illustrated by the carbon tetrabromide which absorbs radiant energy in the ultraviolet region, then dissociates in part at least into free radicals, which in turn possess the capacity to abstract atoms of hydrogen from the polymeric chain to form hydrogen bromide. The latter dissociates in turn into its respective ions, one of which is a proton and this causes the double bond mobility referred to above. Image stability is attained as described previously.

The invention has been described in detail with particular reference to preferred embodiments thereof, but it will be understood that variations and modifications can be effected with the spirit and scope of the invention as described hereinabove and as defined in the appended claims.

What I claim is:

1. A light-sensitive composition comprising (1) a resinous linear polymer selected from the group consisting of a homopolymer of cyclopentadiene and a homopolymer of a cyclohexadiene, and (2) a halogenated methane sensitizing compound selected from those represented by the following general formula:

wherein R represents a member selected from the group consisting of hydrogen, bromine, iodine and chlorine, $R_1$ represents a member selected from the group consisting of hydrogen, bromine and iodine and each X represents a member selected from the group consisting of bromine and iodine, in the proportions of from 50 to 95% by weight of said polymer and from 50 to 5% by weight of said halogenated methane sensitizing compound.

2. A light-sensitive composition according to claim 1 wherein the said polymer (1) is polycyclopentadiene and wherein the said sensitizing compound (2) is carbon tetrabromide.

3. A light-sensitive composition according to claim 1 wherein the said polymer (1) is polycyclopentadiene and wherein the said sensitizing compound (2) is methylene diiodide.

4. A light-sensitive composition according to claim 1 wherein the said polymer (1 )is polycyclopentadiene and wherein the said sensitizing compound (2) is iodoform.

5. A light-sensitive composition according to claim 1 wherein the said polymer (1) is polycyclopentadiene and wherein the said sensitizing compound (2) is methyl monochlorotribromide.

6. The light-sensitive composition of claim 1 wherein 2,5-di (4-methyl piperidino) hydroquinone is incorporated as a antioxidant inhibitor.

7. A light-sensitive printout element comprising a flexible sheet support having on one surface thereof a light-sensitive layer comprising (1) a resinous linear polymer selected from the group consisting of a homopolymer of cyclopentadiene and a homopolymer of a cyclohexadiene, and (2) a halogenated methane sensitizing compound selected from those represented by the following general formula:

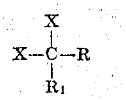

wherein R represents a member selected from the group consisting of hydrogen, bromide, iodine and chlorine, $R_1$ represents a member selected from the group consisting of hydrogen, bromide and iodine and each X represents a member selected from the group consisting of bromine and iodine, in the proportions of from 50 to 95% by weight of said polymer and from 50 to 5% by weight of said halogenated methane sensitizing compound.

8. A light-sensitive printout element according to claim 7 wherein the said polymer (1) is polycyclopentadiene and wherein the said sensitizing compound (2) is carbon tetrabromide.

9. A light-sensitive printout element according to claim 7 wherein the said polymer (1) is methylene diiodide.

10. A light-sensitive printout element according to claim 7 wherein the said polymer (1) is polycyclopentadiene and wherein the said sensitizing compound (2) is iodoform.

11. A light-sensitive printout element according to claim 7 wherein the said polymer (1) is polycyclopentadiene and wherein the said sensitizing compound (2) is methyl monochlorotribromide.

12. A light-sensitive printout element according to claim 7 wherein the said sensitive layer contains 2,5-di (4-methyl piperidino) hydroquinone as an antioxidant.

13. A process for preparing a colored image which comprises exposing a light-sensitive printout element comprising a flexible sheet support having on one surface thereof a light-sensitive layer comprising (1) a resinous linear polymer selected from the group consisting of a homopolymer of cyclopentadiene and a homopolymer of a cyclohexadiene, and (2) a halogenated methane sensitizing compound selected from those represented by the following general formula:

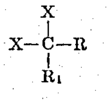

wherein R represents a member selected from the group consisting of hydrogen, bromine, iodine, and chlorine, $R_1$ represents a member selected from the group consisting of hydrogen, bromine and iodine and each X represents a member selected from the group consisting of bromine and iodine, in the proportions of from 50 to 95% by weight of said polymer and from 50 to 5% by weight of said halogenated methane sensitizing compound, to actinic light through a photographic negative whereby a dark blue positive image is formed.

14. The process of claim 13 wherein the said exposed element is then treated with acetone to fix the said colored image.

15. The process of claim 13 wherein the said exposed element is then treated with a tertiary amine to fix the said colored image.

16. The process of claim 13 wherein the said exposed element is then heat treated at 150 to 250° F. to fix the said colored image.

17. A process for preparing a colored image which comprises exposing a light-sensitive printout element comprising a flexible sheet support having on one side thereof a light-sensitive layer comprising (1) a resinous linear polycyclopentadiene and (2) carbon tetrabromide, to actinic light through a photographic negative whereby a dark blue positive image is formed.

18. The process of claim 17 wherein the said exposed element is then treated with acetone to fix the said colored image.

References Cited by the Examiner

UNITED STATES PATENTS 1,587,274 6/62 Beebe et al. ____________ 96—115

OTHER REFERENCES

Ellis: The Chemistry of Synthetic Resins, pages 185–189.

NORMAN G. TORCHIN, *Primary Examiner.*